(12) United States Patent
Chanda et al.

(10) Patent No.: US 8,120,179 B2
(45) Date of Patent: Feb. 21, 2012

(54) AIR GAP INTERCONNECT STRUCTURES AND METHODS FOR FORMING THE SAME

(75) Inventors: Kaushik Chanda, Hopewell Junction, NY (US); Cathryn J. Christiansen, Essex Junction, VT (US); Daniel C. Edelstein, Yorktown Heights, NY (US); Satyanarayana V. Nitta, Yorktown Heights, NY (US); Son V. Nguyen, Yorktown Heights, NY (US); Shom Ponoth, Albany, NY (US); Hosadurga Shobha, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 73 days.

(21) Appl. No.: 12/615,354

(22) Filed: Nov. 10, 2009

(65) Prior Publication Data

US 2011/0108992 A1   May 12, 2011

(51) Int. Cl.
*H01L 23/48* (2006.01)
*H01L 23/52* (2006.01)
*H01L 29/40* (2006.01)

(52) U.S. Cl. .................................. 257/751; 257/758

(58) Field of Classification Search .................. 257/758, 257/750, 760, 751
See application file for complete search history.

(56) References Cited

U.S. PATENT DOCUMENTS

| 6,268,277 | B1 * | 7/2001 | Bang ............................. 438/619 |
| 6,797,409 | B2 * | 9/2004 | Ivey et al. ...................... 428/635 |
| 2004/0124495 | A1 * | 7/2004 | Chen et al. ..................... 257/522 |
| 2005/0164489 | A1 * | 7/2005 | Kloster et al. ................. 438/622 |
| 2006/0264027 | A1 * | 11/2006 | Su et al. ......................... 438/619 |
| 2008/0142989 | A1 * | 6/2008 | Hayashi et al. ................ 257/774 |
| 2009/0200636 | A1 | 8/2009 | Edelstein et al. |

* cited by examiner

*Primary Examiner* — S. V Clark
(74) *Attorney, Agent, or Firm* — Scully, Scott, Murphy & Presser, P.C.; H. Daniel Schnurmann

(57) ABSTRACT

A metal interconnect structure includes at least a pair of metal lines, a cavity therebetween, and a dielectric metal-diffusion barrier layer located on at least one portion of walls of the cavity. After formation of a cavity between the pair of metal lines, the dielectric metal-diffusion barrier layer is formed on the exposed surfaces of the cavity. A dielectric material layer is formed above the pair of metal lines to encapsulate the cavity. The dielectric metal-diffusion barrier layer prevents diffusion of metal and impurities from one metal line to another metal line and vice versa, thereby preventing electrical shorts between the pair of metal lines.

18 Claims, 19 Drawing Sheets

AIR GAP INTERCONNECT STRUCTURES AND METHODS FOR FORMING THE SAME

FIELD OF THE INVENTION

The present invention relates to metal interconnect structures, and particularly to metal interconnect structures including air gap cavities and methods of manufacturing the same.

BACKGROUND OF THE INVENTION

Signal delay in metal interconnect structures depends on a time constant known as an RC delay, which is the product of the resistance of a metal line through which electrical current flows and the capacitance between the metal line and neighboring conductive structures. The capacitance is proportional to the effective dielectric constant of the dielectric materials between the metal line and the neighboring conductive structures and the effective area of the capacitive structure including the metal line. Moreover, the capacitance is inversely proportional to the effective distance between the metal line and the neighboring conductive structures.

The effective area of the capacitive structure and the effective distance between the metal line are geometrical factors that depend on the design of a metal interconnect structure. The effective dielectric constant can be decreased by employing materials having a low dielectric constant. For example, advanced semiconductor chips designed for high performance employ low dielectric constant (low-k) materials having a dielectric constant less than 3.9, which is the dielectric constant of silicon oxide. Such low-k dielectric materials include organosilicate glass (OSG) and low-k spin-on materials.

Formation of air cavities between metal lines can decrease the effective dielectric constant of a capacitive structure further. For example, U.S. Patent Application Publication No. 2009/0200636 discloses a cavity having a dielectric constant of 1.0 that is embedded between neighboring metal lines. Such air cavities, however, can increase time dependent intra-level dielectric failure by providing a surface diffusion path for impurities along the surface of a cavity. Further, a misalignment during a lithographic step employed to pattern a cavity can result in placement of sidewalls of metal lines in proximity to a cavity surface to exacerbate the diffusion of impurities along the surface of the cavity. Thus, the unintended side effect of a cavity can be deterioration of electrical reliability between a neighboring pair of metal lines around the cavity.

SUMMARY OF THE INVENTION

The present invention provides metal interconnect structures including at least a pair of metal lines, a cavity therebetween, and a dielectric metal-diffusion barrier layer located on at least one portion of walls of the cavity. After formation of a cavity between the pair of metal lines, the dielectric metal-diffusion barrier layer is formed on the exposed surfaces of the cavity. A dielectric material layer is formed above the pair of metal lines to encapsulate the cavity. The dielectric metal-diffusion barrier layer prevents diffusion of metal and impurities from one metal line to another metal line and vice versa, thereby preventing electrical shorts between the pair of metal lines.

According to an embodiment of the present invention, a metal interconnect structure is provided, which includes at least two metal lines embedded in a first dielectric material layer; a dielectric cap material layer located on a top surface of the first dielectric material layer and top surfaces of the at least two metal lines; a second dielectric material layer located above the dielectric cap material layer; a cavity embedded in the first and second dielectric material layers; and at least one dielectric metal-diffusion barrier layer located at least on an upper surface of the dielectric cap material layer and underneath the cavity.

According to another embodiment of the present invention, another metal interconnect structure is provided, which includes at least two metal lines embedded in a first dielectric material layer; a dielectric cap material layer located on a top surface of the first dielectric material layer and top surfaces of the at least two metal lines; a second dielectric material layer located above the dielectric cap material layer; a cavity embedded in the first and second dielectric material layers; and at least one dielectric metal-diffusion barrier layer contacting top surfaces of the at least two metal lines and sidewall surfaces of the first dielectric material layer.

According to yet another embodiment of the present invention, yet another metal interconnect structure is provided, which includes at least two metal lines embedded in a first dielectric material layer; a dielectric cap material layer located directly on a top surface of the first dielectric material layer and top surfaces of the at least two metal lines; a second dielectric material layer located above the dielectric cap material layer; a cavity embedded in the first and second dielectric material layers; and a dielectric metal-diffusion barrier layer located on sidewall surfaces of the first dielectric material layer and laterally surrounding the cavity.

According to still embodiment of the present invention, a method of forming a metal interconnect structure is provided, which includes forming at least two metal lines in an upper portion of a first dielectric material layer; forming a dielectric cap material layer on top surfaces of the first dielectric material layer and the at least two metal lines; recessing a portion of the first dielectric material layer between the at least two metal lines to form a trench; forming at least one dielectric metal-diffusion barrier layer on at least a portion of surfaces of the trench; and forming a second dielectric material layer over the dielectric metal-diffusion barrier layer, whereby the trench is sealed by the second dielectric material layer to form a cavity.

DETAILED DESCRIPTION OF THE INVENTION

Figure 1:
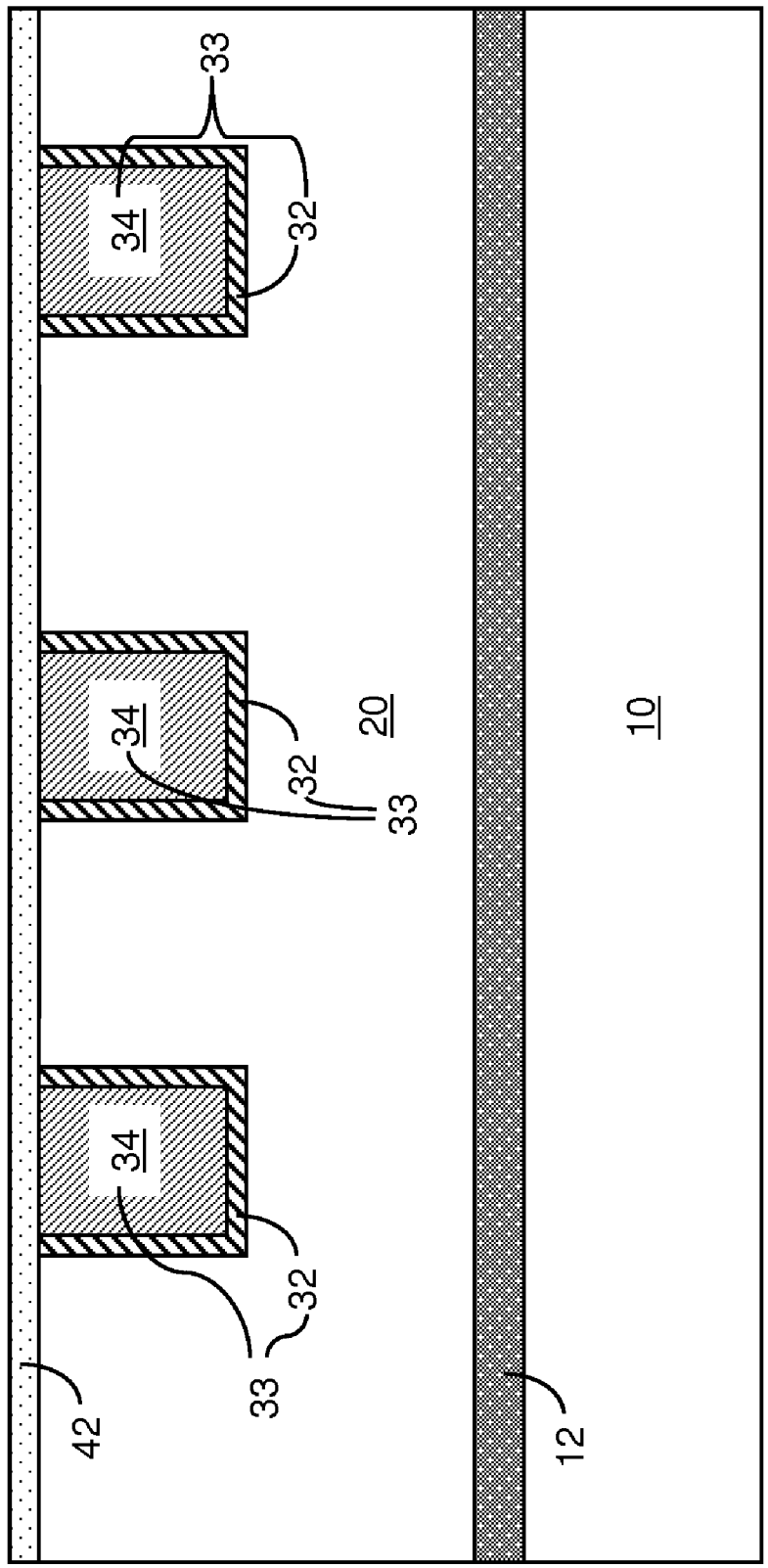
FIG. 1 is a vertical cross-sectional view of a first exemplary metal interconnect structure after formation of at least two metal lines embedded in a first dielectric material layer and a dielectric cap material layer according to a first embodiment of the present invention.

As stated above, the present invention relates to metal interconnect structures including air gap cavities and methods of manufacturing the same, which are described herein with accompanying figures. Throughout the drawings, the same reference numerals or letters are used to designate like or equivalent elements. The drawings are not necessarily drawn to scale.

As used herein, a "critical dimension" is the smallest dimension that can be printed in a photoresist employing a single lithographic exposure and without employing non-lithographic methods.

As used herein, a "lithographic dimension" is a dimension that is equal to or greater than the critical dimension.

As used herein, a "sublithographic dimension" is a dimension that is less than the critical dimension.

As used herein, a "ring" is an element having a three-dimensional shape that may be contiguously stretched or deformed to a torus without forming or destroying a contact between any pair of points in the three-dimensional shape.

As used herein, an element is "ring-shaped" if the shape of said element is a ring.

As used herein, a first element "encapsulates" a second element if all outer surfaces of the second element are located within inner surfaces of the first element.

Referring to FIG. 1, a first exemplary metal interconnect structure according to a first embodiment of the present invention includes a material stack, from bottom to top, of an underlying dielectric material layer 10, an underlying dielectric cap layer 12, a first dielectric material layer 20, and a dielectric cap material layer 42. The material stack can be formed over a semiconductor substrate (not shown) including at least one semiconductor device such as a field effect transistor, a bipolar transistor, and a diode.

The underlying dielectric material layer 10 and the first dielectric material layer 20 can include an oxide based conventional dielectric material or a low-k dielectric material. The oxide based conventional dielectric material has a dielectric constant k from about 3.6 to about 3.9. The low-k dielectric material has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network. Both the spin-on low-k dielectric material and the CVD low-k dielectric material may be porous, which decreases the dielectric constant of the lower dielectric material layer 10. Each of the underlying dielectric material layer 10 and the first dielectric material layer 20 can be a composite dielectric material stack that includes a stack of at least two of oxide based conventional dielectric materials, spin-on low-k dielectric materials, and CVD low-k dielectric materials. The thickness of the underlying dielectric material layer 10 and the thickness of the first dielectric material layer 20 can be from 50 nm to 5,000 nm, although lesser and greater thicknesses can also be employed.

The underlying dielectric material layer 10 can be formed over semiconductor devices and include at least one conductive contact via structure (not shown), or can be a metal interconnect layer embedding at least one metal line (not shown). The underlying dielectric cap layer 12 and the dielectric cap material layer 42 include a material that retards diffusion of metal and impurity atoms. For example, the underlying dielectric cap layer 12 and the dielectric cap material layer 42 can include silicon nitride, silicon oxynitride, silicon carbide, silicon boride, silicon carbide nitride, or a stack thereof. The thickness of the underlying dielectric cap layer 12 and the thickness of the dielectric cap material layer 42 can be from 5 nm to 100 nm, although lesser and greater thicknesses can also be employed.

At least two metal lines 33 are formed in an upper portion of the first dielectric material layer 20 by lithographically patterning line trenches in the upper portion of the first dielectric material layer 20 and filling the line trenches with at least one conductive material. Each of the at least two metal lines 33 includes a metallic liner portion 32 that contacts surfaces of the first dielectric material layer 20 and a metal fill portion 34 that fills a cavity within the metallic liner portions 32. Typically, the metallic liner portions 32 include a conductive nitride such as TaN, TiN, and WN. The metallic liner portions 32 are formed by physical vapor deposition (PVD). Metal fill portions 34 include a conductive metal such as Cu, W, and Al. The metal fill portions 34 can be formed by a combination of physical vapor deposition and electroplating, followed by a planarization step that removed excess materials above the top surface of the first dielectric material layer 20. The at least two metal lines 33 can be formed as metal wiring structures that provide only horizontal interconnection or as metal wiring structures that embed at least one metal via structure so that horizontal and vertical metal interconnections are provided. The dielectric cap material layer 42 is formed after the at least two metal lines 33 are formed in the upper portion of the first dielectric material layer 20.

Figure 2:
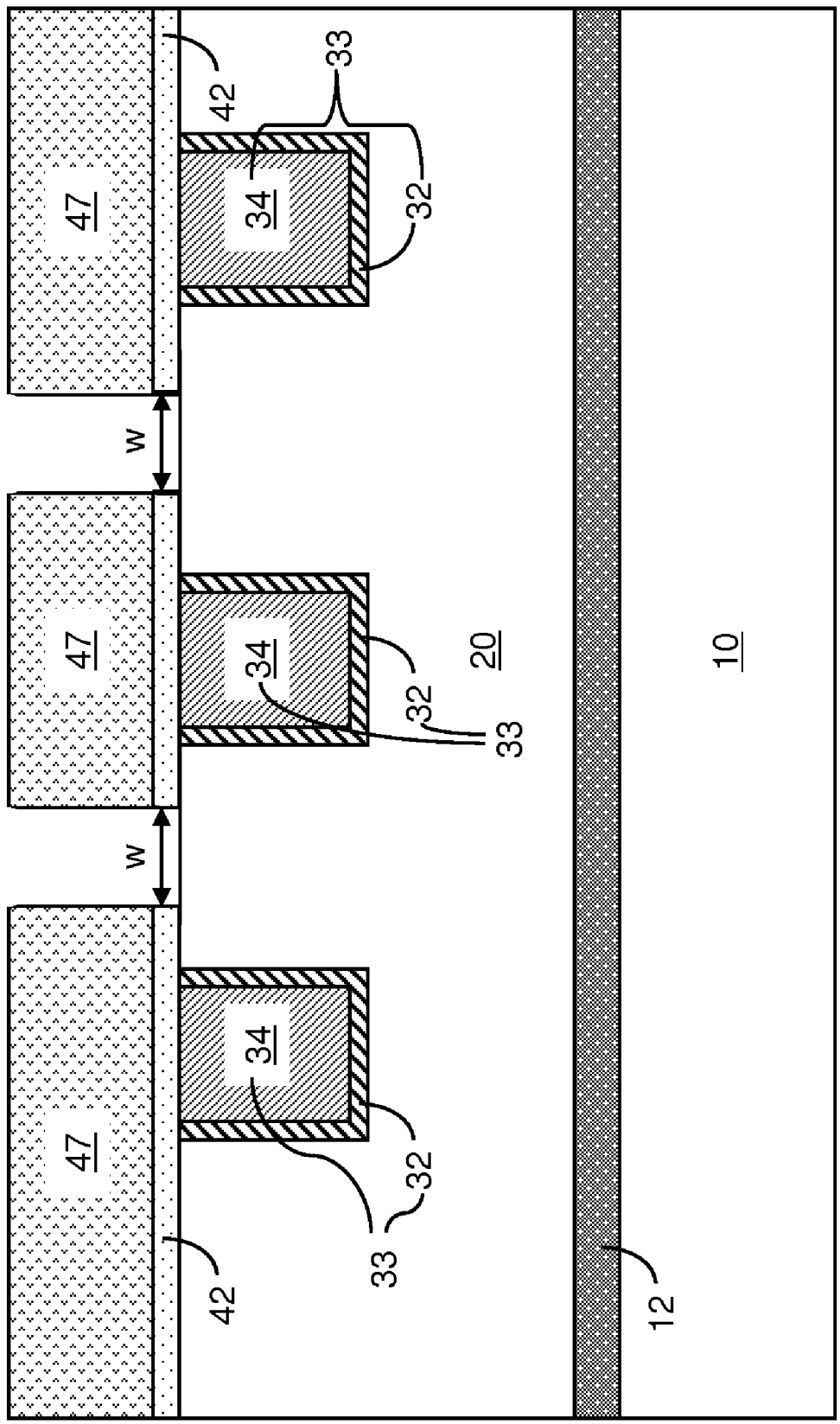
FIG. 2 is a vertical cross-sectional view of the first exemplary metal interconnect structure after lithographically patterning the dielectric cap material layer according to the first embodiment of the present invention.

Referring to FIG. 2, a masking layer 47 is formed over the top surface of the dielectric cap material layer 42. In one embodiment, the masking layer 47 is a photoresist layer that is lithographically patterned. In another embodiment, the masking layer 47 is a material stack that enables formation of at least one opening having a sublithographic lateral dimension. The masking layer 47 can be a stack of material layers and a photoresist layer as described in U.S. Patent Application Publication No. 2009/0200636 to Edelstein et al., which is incorporated herein by reference. For example, the stack of material layer can include an organic layer a Si containing anti-reflective coating (ARC) layer. In general, the masking layer 47 can be any combination of material layers and a photoresist layer configured to generate a pattern that can be transferred into the dielectric cap material layer 42 to form at least one opening therein. The width w of an opening in the dielectric cap material layer 42 can be a lithographic dimension or a sub-lithographic dimension.

Figure 3:
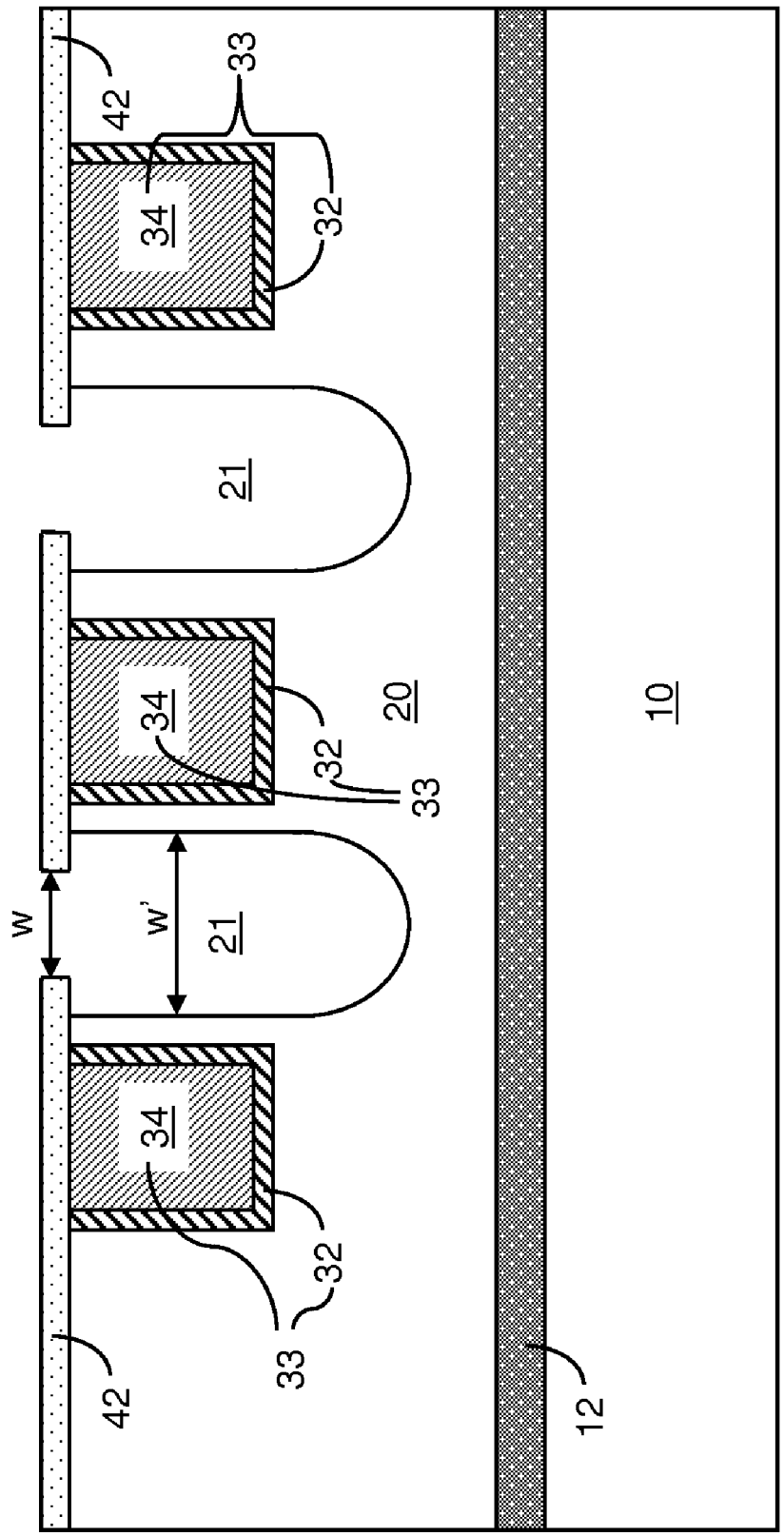
FIG. 3 is a vertical cross-sectional view of the first exemplary metal interconnect structure after formation of at least one cavity according to the first embodiment of the present invention.

Referring to FIG. 3, the pattern in the openings in the dielectric cap material layer 42 is transferred into the first dielectric material layer 20 to form at least one trench 21 using the masking layer 47 and by a combination of reactive ion etch, ash demethylation and wet chemistry. The extent of the undercut of 42 depends on the demethylation amount of the SiCOH ILD during the ash step. The recessed portions of the first dielectric material layer 20 can include a portion of the first dielectric material layer 20 between the at least two metal lines 33. In one embodiment, the masking layer 47 is employed as the etch mask as well. In case the masking layer 47 is an organic material, the masking layer 47 can be removed during an ash step that is performed after formation of the at least one trench. In another embodiment, the masking layer 47 is removed prior to forming the at least one trench 21 or during the formation of the at least one trench 21. The etch can be an anisotropic etch, an isotropic etch, or a combination thereof. Preferably, the etch is a combination of an anisotropic etch that transfers the pattern in the dielectric cap material layer 42 at least to a depth of bottom surfaces of the at least one metal line 33 and a subsequent etch that is substantially isotropic and removes the material of the first dielectric material layer 20 laterally. The lateral etch can be performed by using a wet etch, employing a wet etchant such as dilute hydrofluoric acid (DHF), in which the demethylated dielectric material is removed. Not necessarily but optionally, the width w' of a trench 21 can be greater than the width w of the opening thereabove in the dielectric cap material layer 42.

Figure 4:
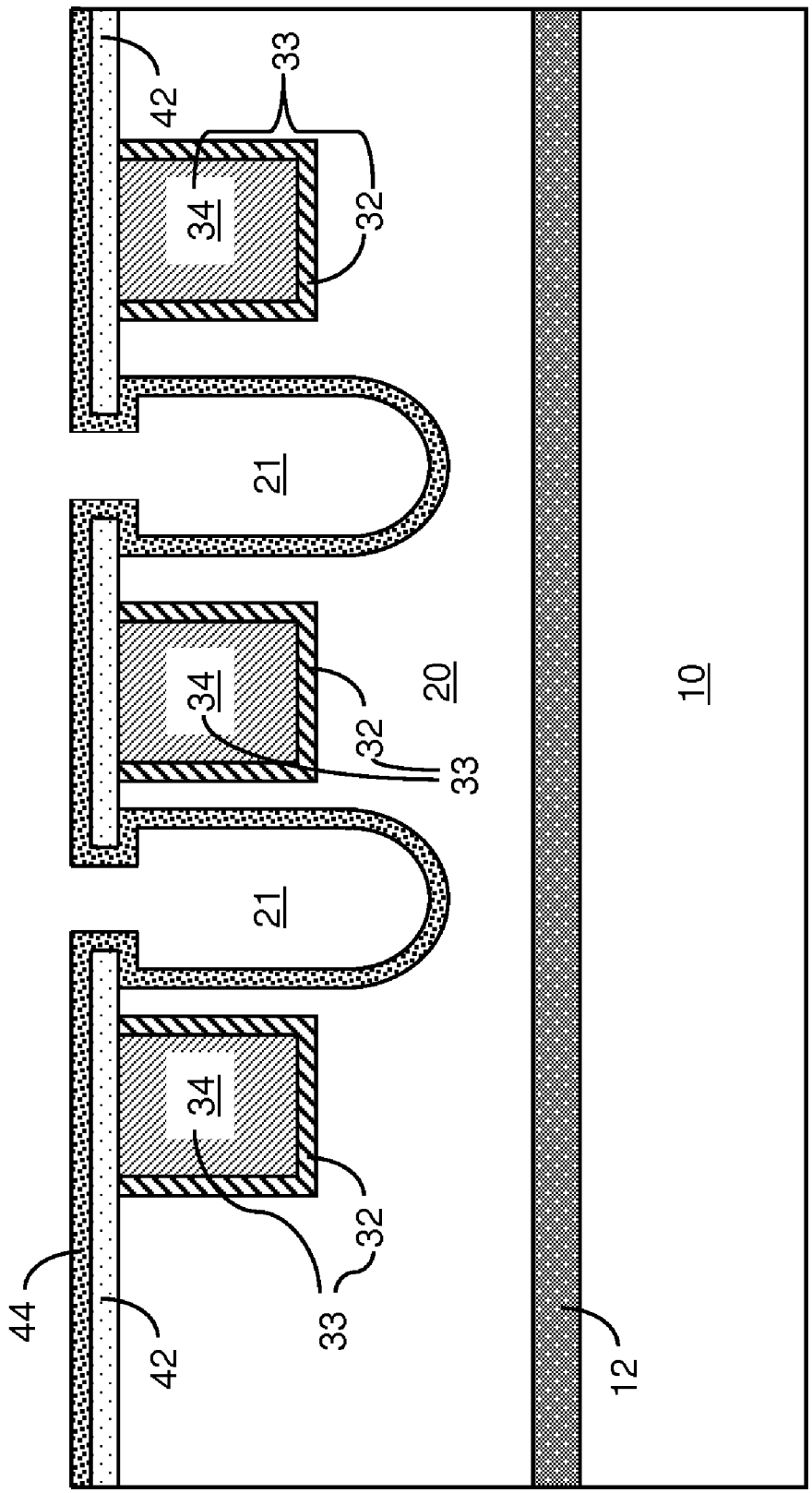
FIG. 4 is a vertical cross-sectional view of the first exemplary metal interconnect structure after formation of a dielectric metal diffusion barrier layer according to the first embodiment of the present invention.

Referring to FIG. 4, a dielectric metal-diffusion barrier layer 44 is formed on all surfaces of the at least one trench 21 and exposed surfaces of the dielectric cap material layer 42. The dielectric metal-diffusion barrier layer 44 includes a material that prevents or retards diffusion of metal and impurity atoms. Non-limiting examples of materials that can be employed for the dielectric metal-diffusion barrier layer 44 include silicon nitride, silicon carbide nitride, silicon carbide, silicon boride, silicon carbide boride, a dielectric metal oxide, a dielectric metal nitride, a dielectric metal silicate, or a combination thereof. The dielectric metal oxide and the dielectric metal nitride can be a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and an alloy thereof. Each value of x is independently from 0.5 to 3 and each value of y is independently from 0 to 2. The dielectric metal silicate can be a silicate of any of the dielectric metal oxide and the dielectric metal nitride. The dielectric metal-diffusion barrier layer 44 can be formed by plasma enhanced chemical vapor deposition (PECVD), high density plasma chemical vapor deposition (HDPCVD), atomic layer deposition (ALD), or any other type of chemical vapor deposition (CVD). The dielectric metal-diffusion barrier layer 44 can be treated with radiation such as ultraviolet radiation during or after deposition. The dielectric metal-diffusion barrier layer 44 is a single contiguous layer that is formed directly on the dielectric cap material layer 42.

The dielectric metal-diffusion barrier layer 44 can be deposited conformally or non-conformally. The thickness of the dielectric metal-diffusion barrier layer 44 as measured above the dielectric cap material layer 42 can be from 3 nm to 100 nm, although lesser and greater thicknesses can also be employed. The thickness of the dielectric metal-diffusion barrier layer 44 as measured on sidewalls of the first dielectric material layer 20 around the at least one trench 21 can be from 1 nm to 100 nm, although lesser and greater thicknesses can also be employed. Preferably, the at least one trench 21 is not sealed at the opening in the dielectric cap material layer 42, which can be effected by selecting the thickness of the dielectric metal-diffusion barrier layer 44 on sidewalls of the dielectric cap material layer 42 to be less than one half of the width of an opening in the dielectric cap material layer 42.

Figure 5:
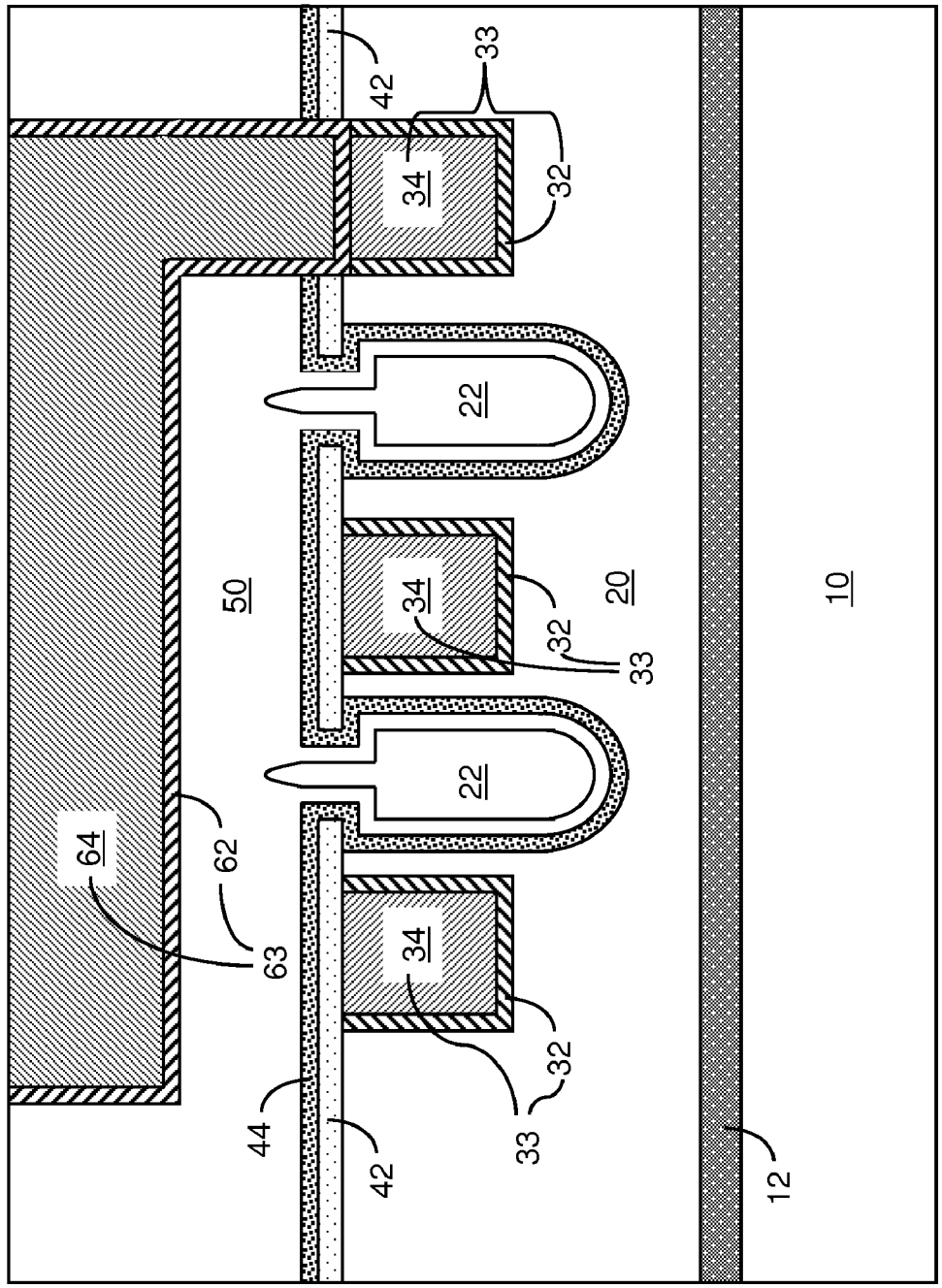
FIG. 5 is a vertical cross-sectional view of the first exemplary metal interconnect structure after formation of a second dielectric material layer and at least one second level metal interconnect structure according to the first embodiment of the present invention.

Referring to FIG. 5, a second dielectric material layer 50 is formed over the dielectric metal-diffusion barrier layer 44. The material of the second dielectric material layer 50 is deposited on the surfaces of the dielectric metal-diffusion barrier layer 44 around the at least one trench. As the material of the second dielectric material layer 50 accumulates over the at least one trench (See FIG. 4) during deposition, the trench 21 is pinched off to form at least one cavity 22, which is encapsulated by the material of the second dielectric material layer 50. Each of the at least one trench 21 is sealed by the second dielectric material layer 50 to form a cavity 22. In some embodiments, the amount of material of the second dielectric material layer 50 that is deposited on the sidewalls of the dielectric metal-diffusion barrier layer 44 around the at least one cavity can be negligible if the deposition process employed for formation of the second dielectric material layer 50 is non-conformal.

At least one second level metal interconnect structure 63 is formed in the second dielectric material layer 50. Formation of the at least one second level metal interconnect structure 63 can be effected by forming a line trench and/or a via hole and filling the line trench and/or the via hole with at least one conductive material. For example, the at least one second level metal interconnect structure 63 can include a second level metallic liner portion 62 and a second level metal fill portion 64. The at least one second level metal interconnect structure 63 can include a metal line and a metal via that are integrally formed.

Each of the at least one cavity 22 is spaced from the first dielectric material layer 20 by a single contiguous layer of the dielectric metal-diffusion barrier layer 44. Thus, the first dielectric material layer 20 does not directly contact the material of the second dielectric material layer 50.

Figure 6:
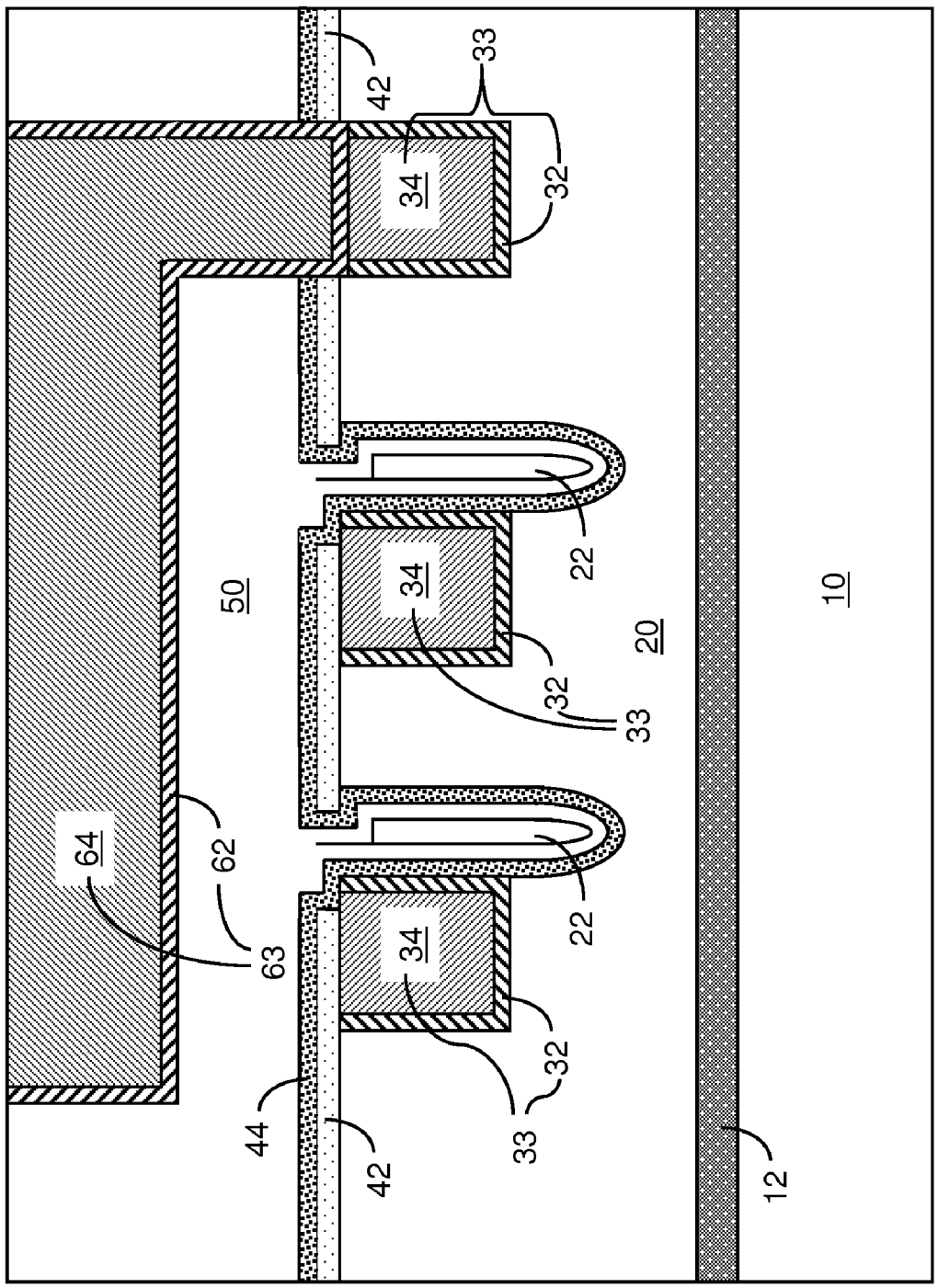
FIG. 6 is a vertical cross-sectional view of a first variation of the first exemplary metal interconnect structure according to the first embodiment of the present invention.

Referring to FIG. 6 a first variation of the first exemplary metal interconnect structure according to the first embodiment of the present invention is derived from the first exemplary metal interconnect structure when an overly error is introduced during the patterning of openings in the dielectric cap material layer 42 at a step corresponding to FIG. 2. In this case, the a top surface and a sidewall of the at least two metal lines 33 can be exposed to a cavity as the material of the first dielectric material layer 20 is removed from underneath the at least one opening in the dielectric cap material layer 42. Despite the overlay error, the exposed top surfaces and the sidewall surfaces of the at least two metal lines 33 are covered by the dielectric metal-diffusion barrier layer 44. Specifically, the dielectric metal-diffusion barrier layer 44 contacts the exposed portions of the metallic liner portions 32 and metal fill portions 34 to prevent diffusion of metallic materials to surfaces of the cavity 22, in which the diffusion of any metal or impurities could be accelerated. The presence of the dielectric metal-diffusion barrier layer 44 between each of the at least two metal lines 33 and the at least one cavity 22 prevents or retards the diffusion of metal or other impurities across the dielectric metal-diffusion barrier layer 44.

Figure 7:
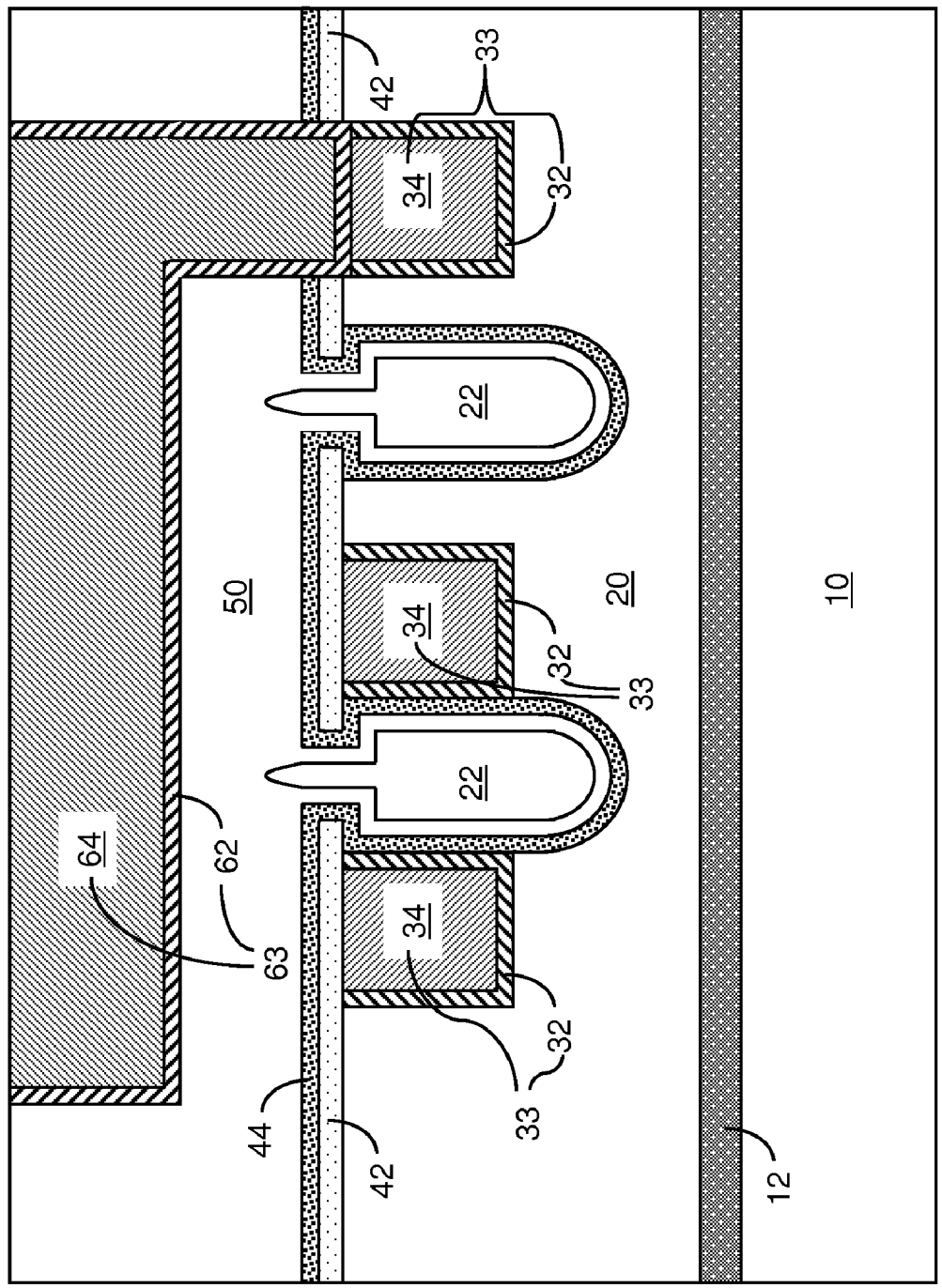
FIG. 7 is a vertical cross-sectional view of a second variation of the first exemplary metal interconnect structure according to the first embodiment of the present invention.

Referring to FIG. 7, a second variation of the first exemplary metal interconnect structure according to the first embodiment of the present invention is derived from the first exemplary metal interconnect structure either by reducing the distance between an adjacent pair of metal lines among the at least two metal lines 33 or by extending the etch during the formation of the at least one trench 21 (See FIG. 3) so that the sidewalls of the metallic liner portions 32 are exposed after formation of the at least one trench 21. In this case, the dielectric metal-diffusion barrier layer 44 is formed directly on the sidewalls of the metallic liner portions 32, but does not contact a top surface of the metallic liner portions 32 or a top surface of the metal fill portions 34.

Figure 8:
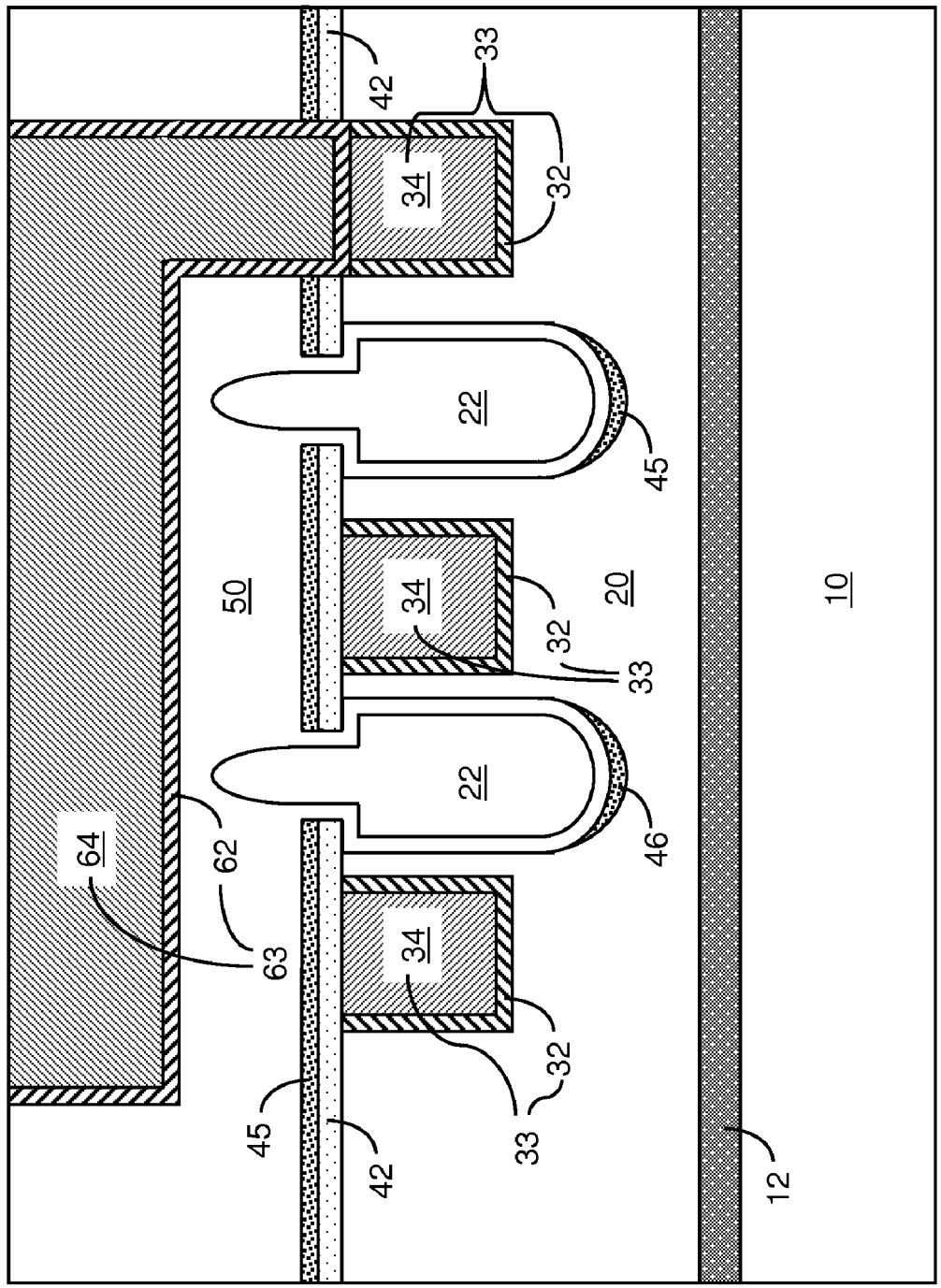
FIG. 8 is a vertical cross-sectional view of a second exemplary metal interconnect structure according to a second embodiment of the present invention.

Referring to FIG. 8, a second exemplary metal interconnect structure according to a second embodiment of the present invention is derived from the first exemplary metal interconnect structure of FIG. 3 by employing a non-conformal deposition process to deposit material that retard diffusion of metal and impurity atoms. Preferably, the deposition process is directional, i.e., anisotropic, so that a material is deposited on horizontal surfaces and is not deposited on vertical surfaces or shielded surfaces. Specifically, sidewalls of the at least one trench 21 (See FIG. 3) is shielded from a directional beam of materials that impinge into the at least one trench 21 in the direction that is substantially normal to the upper surface of the dielectric cap material layer 42. Thus, the overhanging portions of the dielectric cap material layer 42 block the impinging material to prevent deposition on the sidewalls of the first dielectric material 20 in the at least one trench 21.

A first dielectric metal-diffusion barrier portion 45 is formed on the upper surface of the dielectric cap material layer 42, and a second dielectric metal-diffusion barrier portion 46 is formed at a bottom surface of the at least one trench 21. Upon formation of the at least one cavity 22 by deposition of the second dielectric material layer 50, the second dielectric metal-diffusion barrier portion 46 is located underneath the at least one cavity 22. The first dielectric metal-diffusion barrier portion 45 and the second dielectric metal-diffusion barrier portion 46 have a same material, which can be any of the material that can be employed for the dielectric metal-diffusion barrier layer 44 of the first embodiment.

The material of the second dielectric material layer 50 contacts the first dielectric material layer 20 between the first dielectric metal-diffusion barrier portion 45 and the second metal-diffusion barrier portion 46. The first and second dielectric metal-diffusion barrier portions (45, 46) are formed in a same deposition step and the first and second dielectric metal-diffusion barrier portions (45, 46) do not contact each other.

Figure 9:
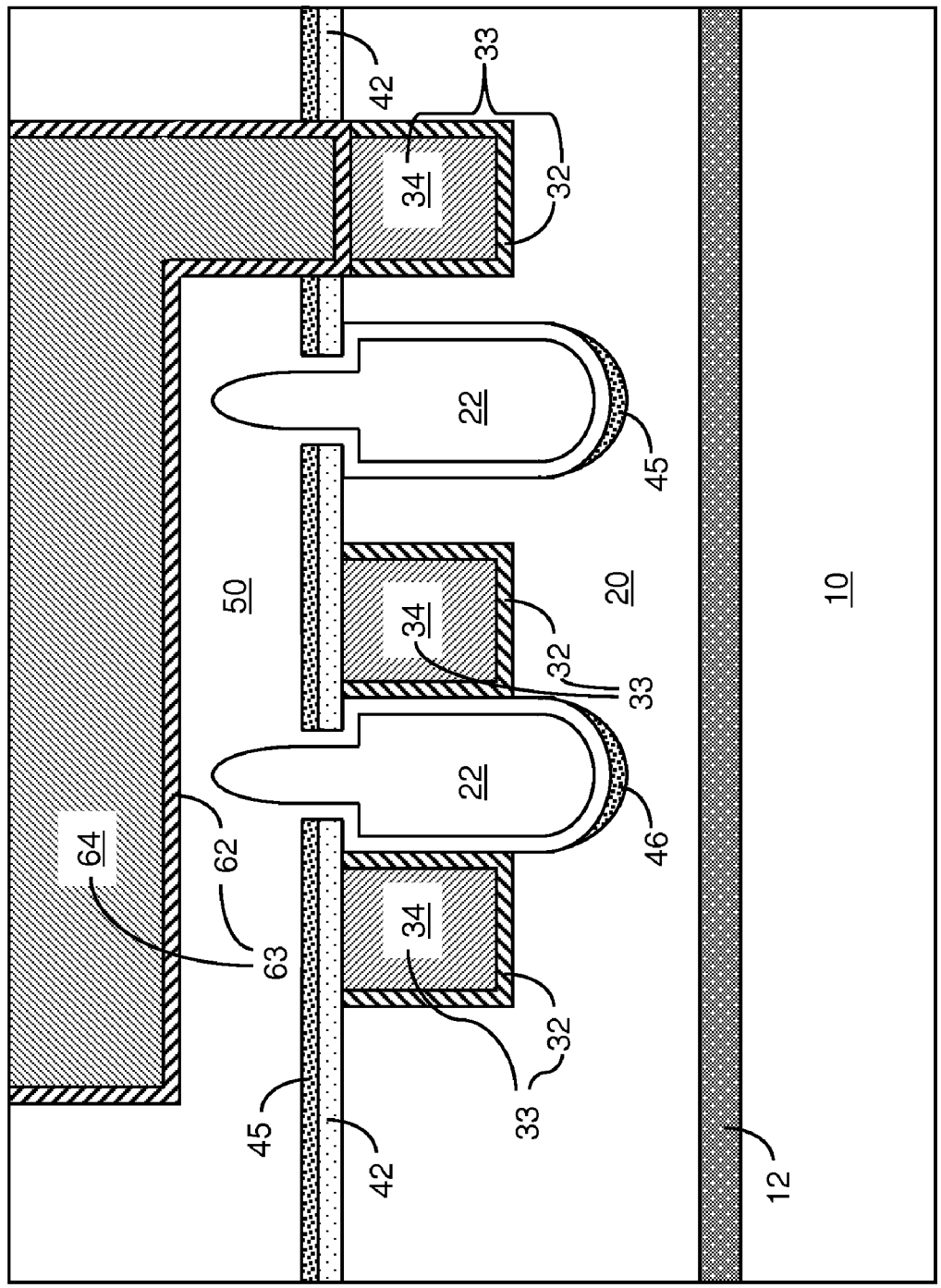
FIG. 9 is a vertical cross-sectional view of a variation of the second exemplary metal interconnect structure according to the second embodiment of the present invention.

Referring to FIG. 9, a variation of the second exemplary metal interconnect structure according to the second embodiment of the present invention is derived from the second exemplary metal interconnect structure either by reducing the distance between an adjacent pair of metal lines among the at least two metal lines 33 or by extending the etch during the formation of the at least one trench 21 (See FIG. 3) so that the sidewalls of the metallic liner portions 32 are exposed after formation of the at least one trench 21. In this case, the material of the second dielectric material layer 50 directly contacts sidewalls of the metallic liner portions 32, but does not contact a top surface of the metallic liner portions 32 or a top surface of the metal fill portions 34.

Figure 10:
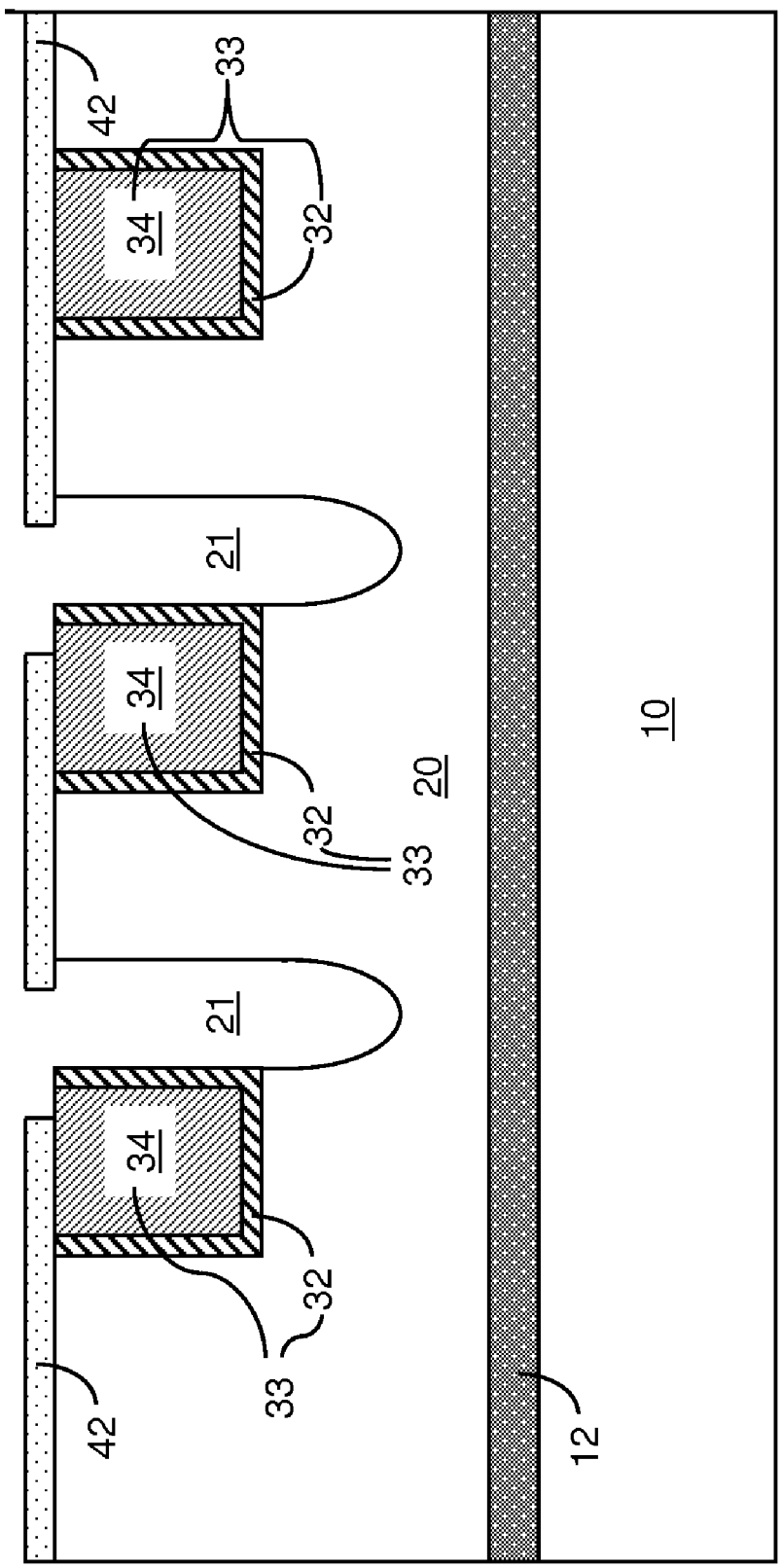
FIG. 10 is a vertical cross-sectional view of a third exemplary metal interconnect structure after formation of at least one trench according to a third embodiment of the present invention.

Referring to FIG. 10, a third exemplary metal interconnect structure according to a third embodiment of the present invention is derived from the first exemplary metal interconnect structure of FIG. 3 when an overlay error is introduced during the patterning of openings in the dielectric cap material layer 42. Top surfaces of metal fill portions 34 and sidewalls of the metallic liner portions 32 are exposed when the at least one trench 21 is formed.

Figure 11:
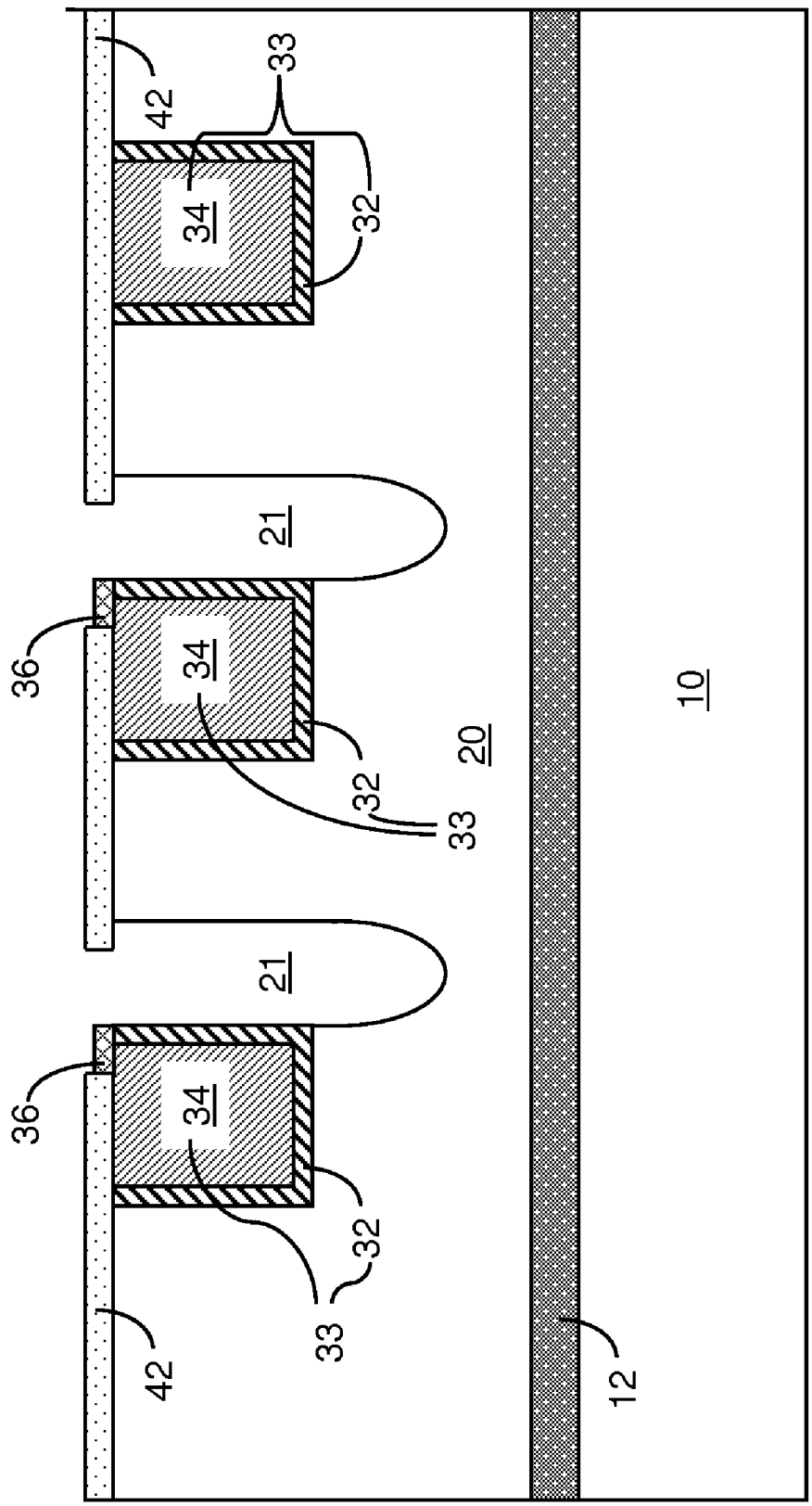
FIG. 11 is a vertical cross-sectional view of the third exemplary metal interconnect structure after selective growth of conductive material portions according to the third embodiment of the present invention.

Referring to FIG. 11, conductive material portions 36 are selectively formed on the exposed surfaces of the metal fill portions 34. For example, if the metal fill portions is composed essentially of elemental copper and the metal fill portions 34 includes a metal nitride material, Electroless plating can be employed to selective grow the conductive material portions 36 including copper on exposed surfaces of the metal fill portions. In general, the conductive material portions 36 includes a material that can be selectively deposited by electroless plating or by CVD and is preferably a copper and oxygen barriers, which include CoWP, CoWB and Ru. CoWP is a compound of Co, W, and P that is formed by electroplating or electroless plating and contains from about 5 atomic percent to about 30 atomic percent P, the balance being a mixture of Co and W. Each conductive material portion 36 is formed on a top surface of the at least two metal lines, wherein the at least one dielectric metal-diffusion barrier layer is located on the conductive material portion.

Figure 12:
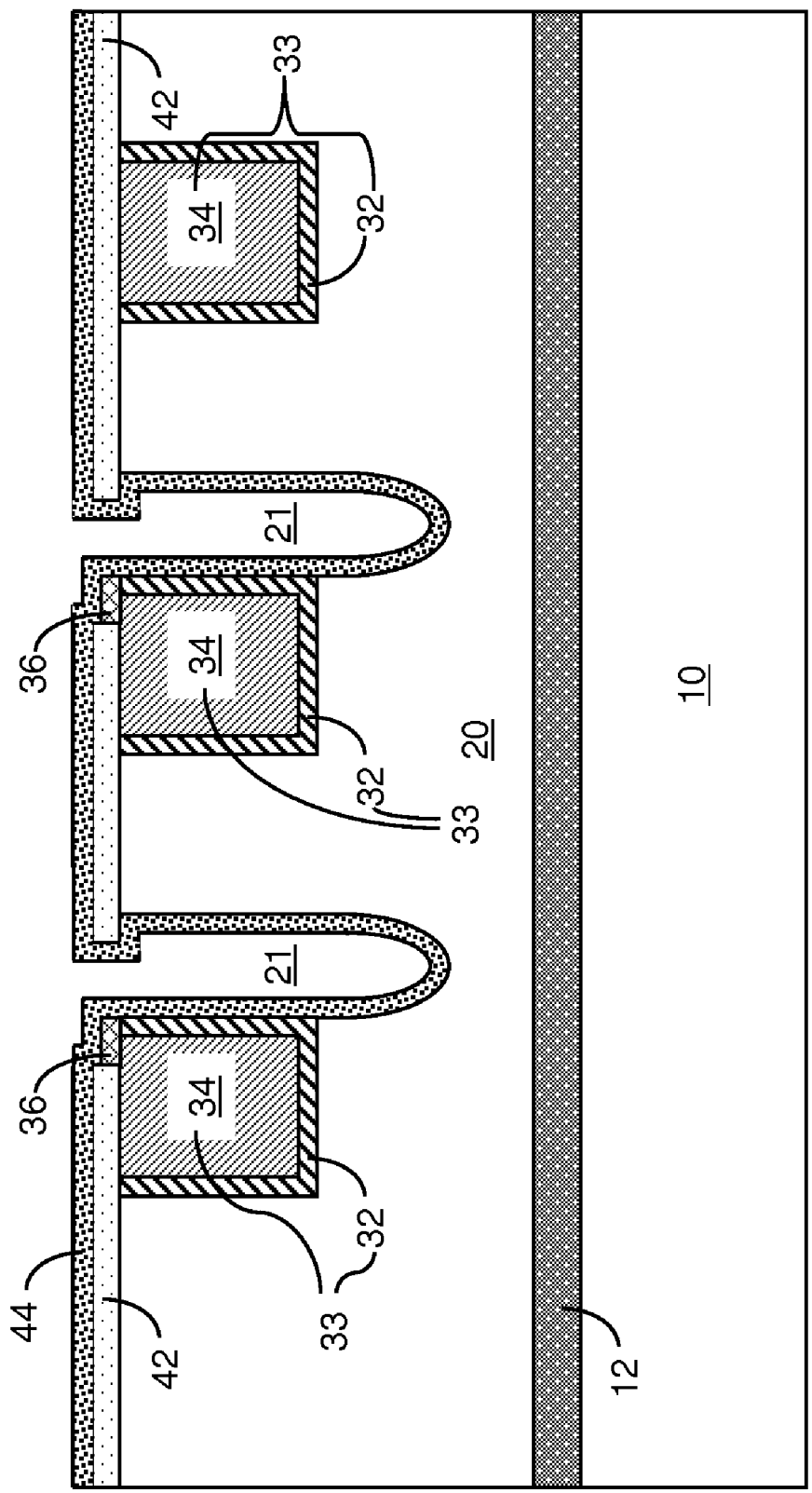
FIG. 12 is a vertical cross-sectional view of the third exemplary metal interconnect structure after formation of a dielectric metal diffusion barrier layer according to the third embodiment of the present invention.

Referring to FIG. 12, a dielectric metal-diffusion barrier layer 44 is formed on surfaces of the at least one cavity 21 and the exposed surfaces of the conductive material portions 36. The dielectric metal-diffusion barrier layer 44 is formed as a single contiguous layer that contacts the sidewall surfaces of the metallic liner portions 32 and all surfaces of the first dielectric material layer 20 in the at least one trench 21.

Figure 13:
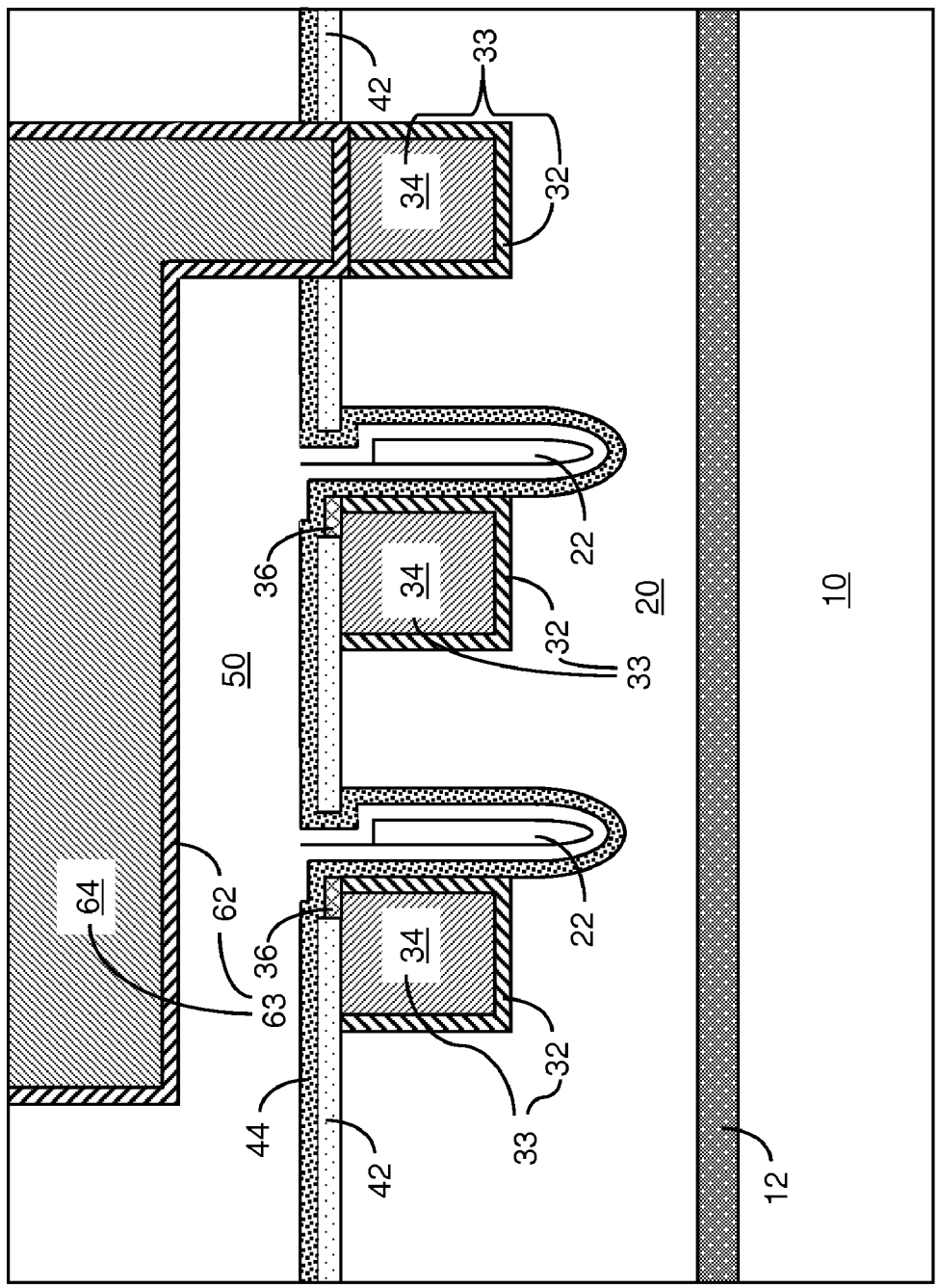
FIG. 13 is a vertical cross-sectional view of the third exemplary metal interconnect structure after formation of a second dielectric material layer and at least one second level metal interconnect structure according to the third embodiment of the present invention.

Referring to FIG. 13, a second dielectric material layer 50 and at least one second level metal interconnect structure 63 are formed as in the first embodiment. The at least one second level metal interconnect structure 63 can include a second level metallic liner portion 62 and a second level metal fill portion 64. The dielectric metal-diffusion barrier layer 44 prevents diffusion of metallic materials between the at least two metal lines 33 and the surfaces of the cavity 22, in which the diffusion of any metal or impurities could be accelerated. The presence of the dielectric metal-diffusion barrier layer 44 between each of the at least two metal lines 33 and the at least one cavity 22 prevents or retards the diffusion of metal or other impurities across the dielectric metal-diffusion barrier layer 44.

Figure 14:
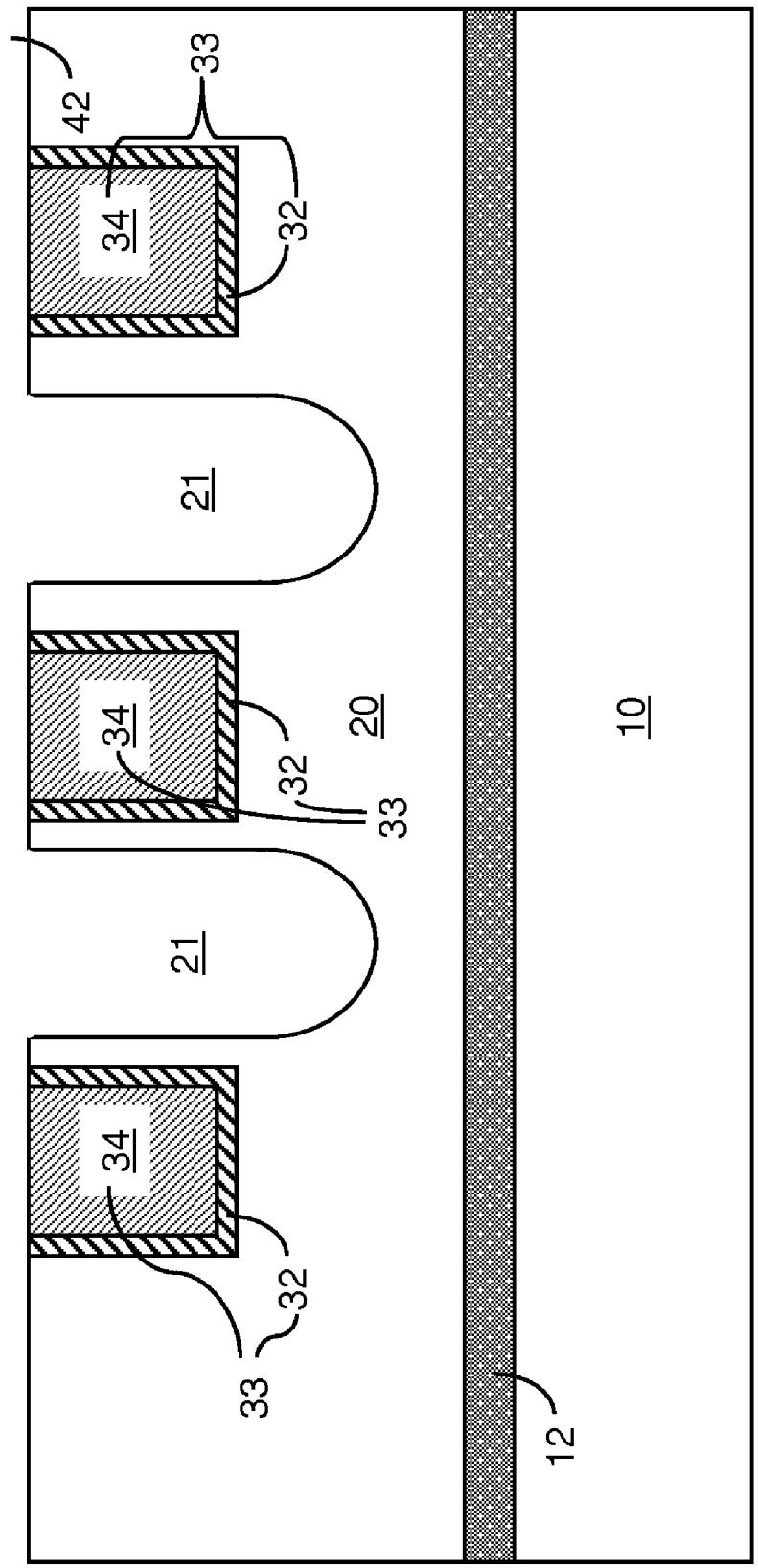
FIG. 14 is a vertical cross-sectional view of a fourth exemplary metal interconnect structure after formation of at least one trench according to a fourth embodiment of the present invention.

Referring to FIG. 14, a fourth exemplary metal interconnect structure according to a fourth embodiment of the present invention is derived from the first exemplary metal interconnect structure of FIG. 3 by selectively removing the dielectric cap material layer 42 while not removing the first dielectric material layer 20 and the at least two metal lines 33.

Figure 15:
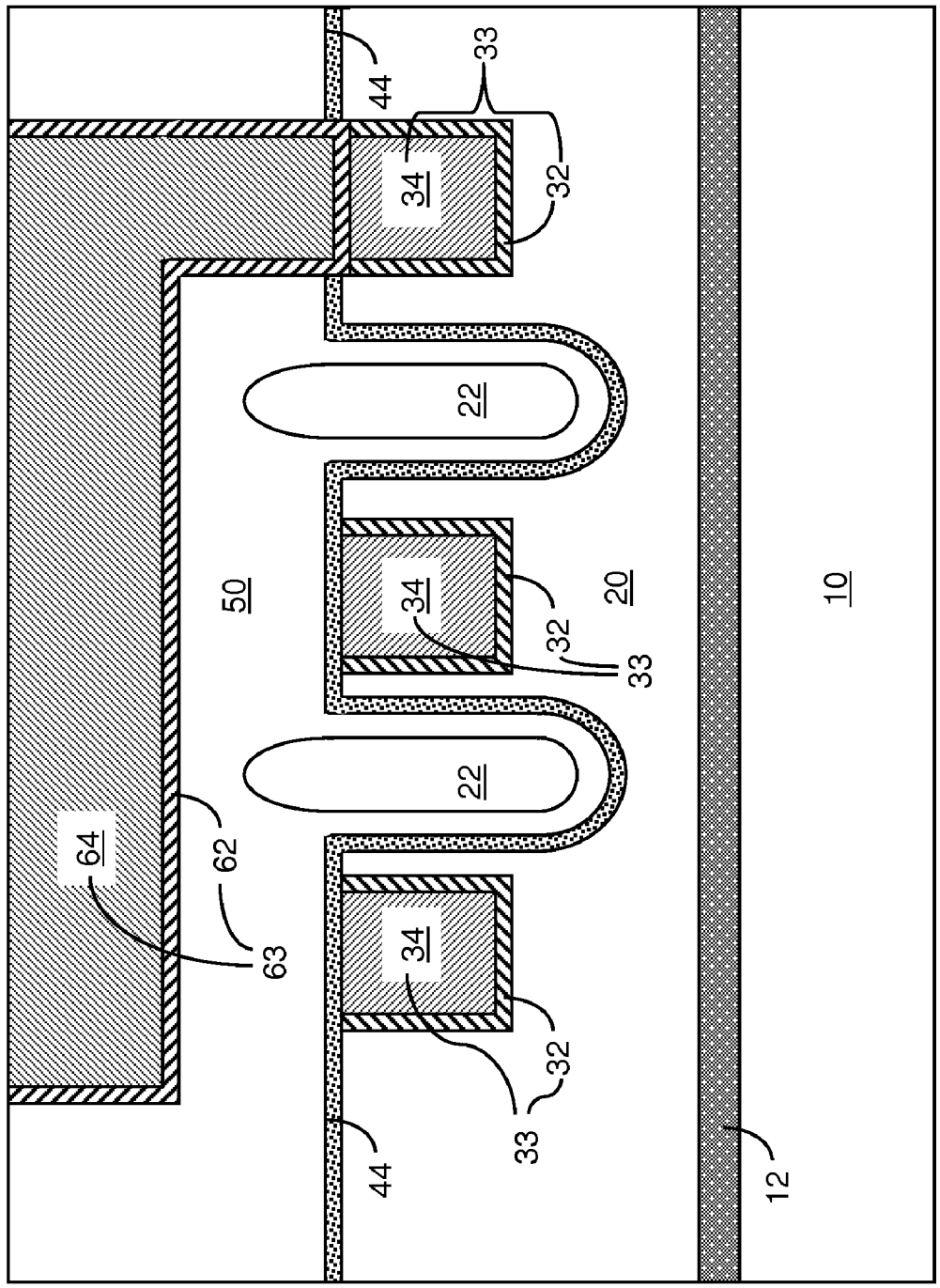
FIG. 15 is a vertical cross-sectional view of the fourth exemplary metal interconnect structure after formation of a second dielectric material layer and at least one second level metal interconnect structure according to the fourth embodiment of the present invention.

Referring to FIG. 15, a dielectric metal-diffusion barrier layer 44 is formed directly on exposed sidewall surfaces of first dielectric material layer 20 in the at least one cavity 21 (See FIG. 14), the top surface of the first dielectric material layer, and the top surfaces of the at least two metal lines 33. The dielectric metal-diffusion barrier layer 44 is formed as a single contiguous layer. The dielectric metal-diffusion barrier layer 44 contacts top surfaces of the at least two metal lines and sidewall surfaces of the first dielectric material layer 20.

A second dielectric material layer 50 and at least one second level metal interconnect structure 63 are formed as in the first embodiment. At least one cavity 22 is formed as the material of the second dielectric material layer 50 encapsulates the at least one cavity 21 (See FIG. 14). The cavity 21 can be lined with the material of the second dielectric material layer 50. The at least one second level metal interconnect structure 63 can include a second level metallic liner portion 62 and a second level metal fill portion 64. The dielectric metal-diffusion barrier layer 44 prevents diffusion of metallic materials between the at least two metal lines 33 and the surfaces of the cavity 22.

Figure 16:
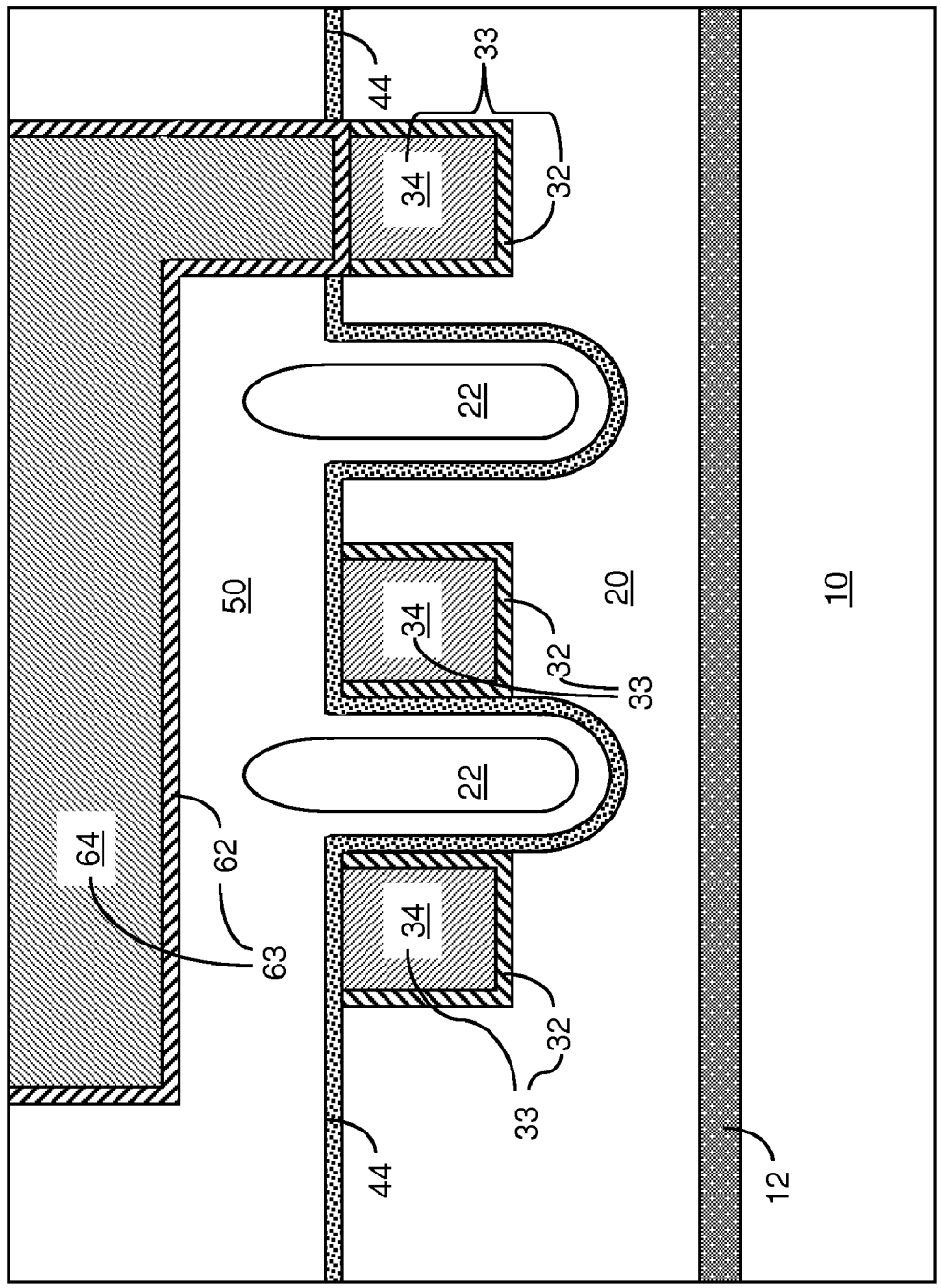
FIG. 16 is a vertical cross-sectional view of a variation of the fourth exemplary metal interconnect structure according to a fourth embodiment of the present invention.

Referring to FIG. 16, a variation of the fourth exemplary metal interconnect structure according to a fourth embodiment of the present invention is derived from the fourth exemplary metal interconnect structure either by reducing the distance between an adjacent pair of metal lines among the at least two metal lines 33 or by extending the etch during the formation of the at least one trench 21 (See FIG. 3) so that the sidewalls of the metallic liner portions 32 are exposed after formation of the at least one trench 21. In this case, the second dielectric material layer 50 is spaced from the first dielectric material layer 20 and the at least two metal lines 33 by the dielectric metal-diffusion barrier layer 44.

Figure 17:
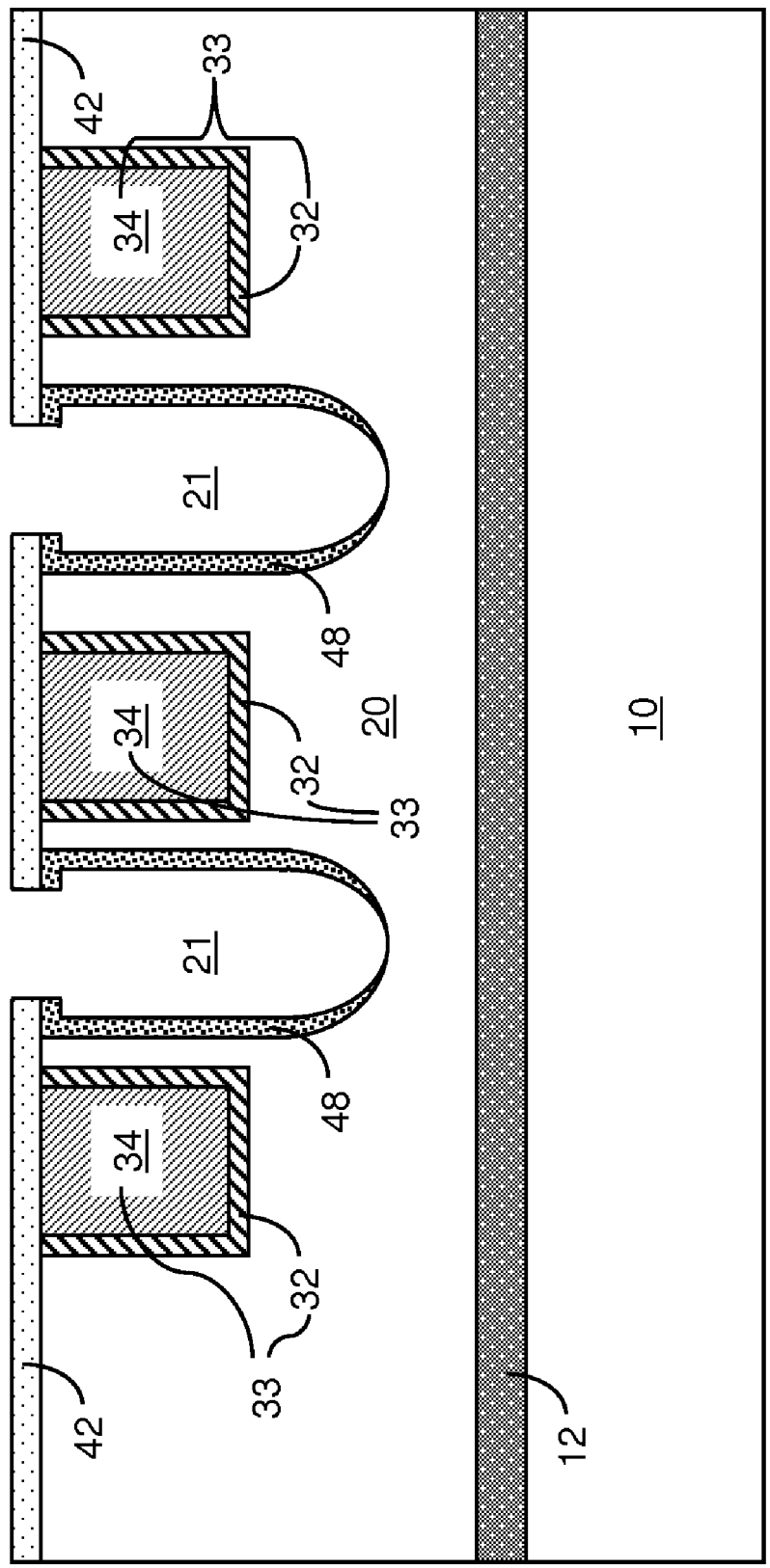
FIG. 17 is a vertical cross-sectional views of a fifth exemplary metal interconnect structure after an anisotropic etch that removes a center portion of a dielectric metal-diffusion barrier layer in each of the at least one cavity according to a fifth embodiment of the present invention.

Referring to FIG. 17, a fifth exemplary metal interconnect structure according to a fifth embodiment of the present invention is derived from the first exemplary metal interconnect structure of FIG. 4 by performing an anisotropic etch on the dielectric metal-diffusion barrier layer 44 (See FIG. 4). The anisotropic etch can be effected by a reactive ion etch. The horizontal portion of the dielectric metal-diffusion barrier layer 44 above the dielectric cap material layer 42 is removed by the anisotropic etch. Further, the portion of the dielectric metal-diffusion barrier layer 44 at a bottom portion of each of the at least one cavity 21 is also removed by the anisotropic etch. As portions of the dielectric metal-diffusion barrier layer 44 are removed by the anisotropic etch, each remaining portion of the dielectric metal-diffusion barrier layer 44 laterally surrounds a trench 22. Remaining portions of the dielectric metal-diffusion barrier layer 44 constitutes at least one dielectric metal-diffusion barrier layer 48, each of which is located around a trench 21 and lines sidewalls of the first dielectric material layer 20 around the trench 21. Each of the at least one dielectric metal-diffusion barrier layer 48 is located on sidewall surfaces of the first dielectric material layer 20.

Figure 18:
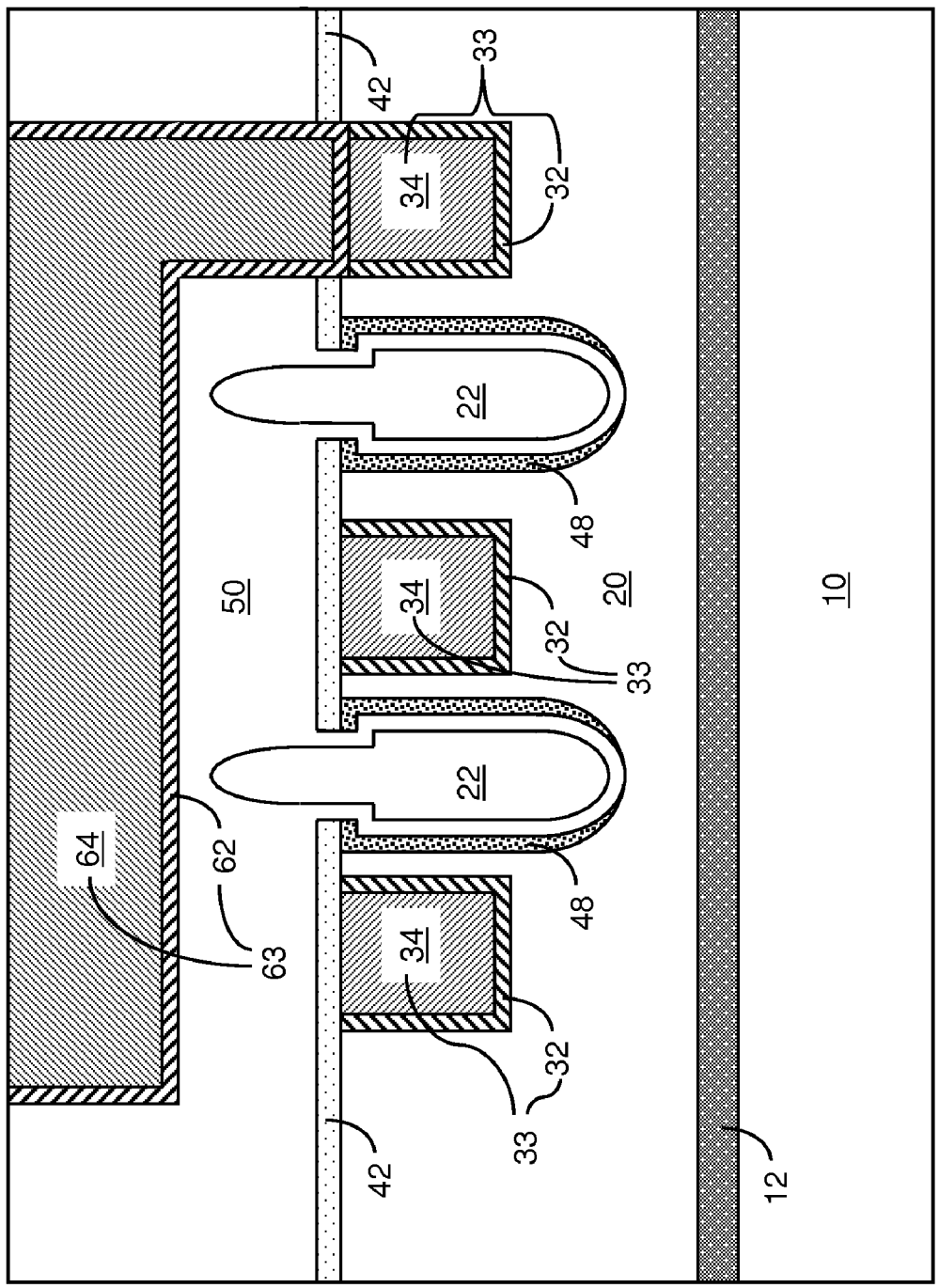
FIG. 18 is a vertical cross-sectional view of the fifth exemplary metal interconnect structure after formation of a second dielectric material layer and at least one second level metal interconnect structure according to the fifth embodiment of the present invention.

Referring to FIG. 18, a second dielectric material layer 50 and at least one second level metal interconnect structure 63 are formed as in the first embodiment. At least one cavity 22 is formed as the material of the second dielectric material layer 50 encapsulates the at least one cavity 21 (See FIG. 17). The cavity 21 can be lined with the material of the second dielectric material layer 50. The at least one second level metal interconnect structure 63 can include a second level metallic liner portion 62 and a second level metal fill portion 64. The dielectric metal-diffusion barrier layer 44 prevents diffusion of metallic materials between the at least two metal lines 33 and the surfaces of the cavity 22.

Each of the at least one dielectric metal-diffusion barrier layer 48 laterally surrounds one of the at least one cavity 22. Each of the at least one cavity 22 is embedded in the first and second dielectric material layers (20, 50), and specifically, the material of the second dielectric layer 50 encapsulates each of the at least one cavity 22. Each of the at least one dielectric metal-diffusion barrier layer 48 is ring-shaped. Thus, each of the at least one dielectric metal-diffusion barrier layer 48 has an opening in an upper portion and another opening in a lower portion. The material of the second dielectric material layer 50 extends through the opening in the upper portion of each of the at least one dielectric metal-diffusion barrier layer 48. Further, the material of the second dielectric material layer 50 extends through the opening underneath the cavity 22 and located in the lower portion of each of the at least one dielectric metal-diffusion barrier layer 48 to contact the first dielectric material layer 20. The at least one dielectric metal-diffusion barrier layer 48 is not present above an interface between the first dielectric material layer 20 and the dielectric cap material layer 42.

Figure 19:
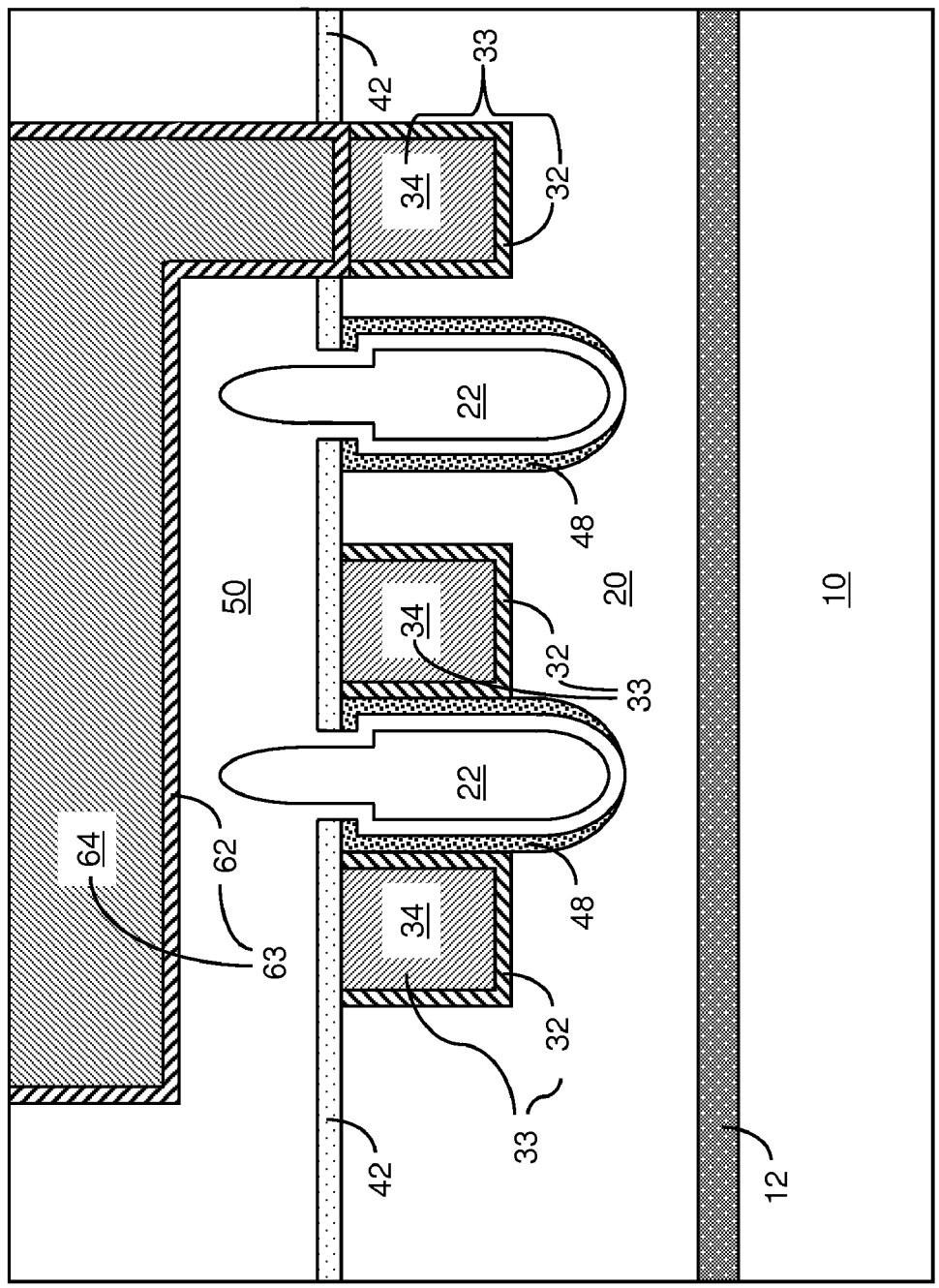
FIG. 19 is a vertical cross-sectional view of a variation of the fifth exemplary metal interconnect structure according to a fifth embodiment of the present invention.

Referring to FIG. 19, a variation of the fifth exemplary metal interconnect structure according to a fifth embodiment of the present invention is derived from the fifth exemplary metal interconnect structure either by reducing the distance between an adjacent pair of metal lines among the at least two metal lines 33 or by extending the etch during the formation of the at least one trench 21 (See FIG. 3) so that the sidewalls of the metallic liner portions 32 are exposed after formation of the at least one trench 21. In this case, the second dielectric material layer 50 contacts the first dielectric material layer 20 through an opening in each of the at least one dielectric metal-diffusion barrier layer 48. The material of the second dielectric material layer 50 is laterally spaced from the at least two metal lines 33 by the at least one dielectric metal-diffusion barrier layer 48.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metal interconnect structure comprising:
   at least two metal lines embedded in a first dielectric material layer;
   a dielectric cap material layer located on a top surface of said first dielectric material layer and top surfaces of said at least two metal lines;
   a second dielectric material layer located above said dielectric cap material layer;
   a cavity embedded in said first and second dielectric material layers; and
   at least one dielectric metal-diffusion barrier layer located at least on an upper surface of said dielectric cap material layer and including a portion located underneath said cavity, wherein said at least one dielectric metal-diffusion barrier layer is a single contiguous layer of a dielectric metal-diffusion barrier material that laterally surrounds said cavity.

2. The metal interconnect structure of claim 1, wherein said cavity is spaced from said first dielectric material layer by said single contiguous layer.

3. The metal interconnect structure of claim 1, wherein said first dielectric material layer does not directly contact a material of said second dielectric material layer.

4. The metal interconnect structure of claim 1, wherein said at least one dielectric metal-diffusion barrier layer includes a first dielectric metal-diffusion barrier portion located on said upper surface of said dielectric cap material layer and a second dielectric metal-diffusion barrier portion located underneath said cavity.

5. The metal interconnect structure of claim 4, wherein a material of said second dielectric material layer contacts said first dielectric material layer between said first dielectric metal-diffusion barrier portion and said second metal-diffusion barrier portion.

6. The metal interconnect structure of claim 1, wherein a material of said second dielectric material layer encapsulates said cavity.

7. The metal interconnect structure of claim 1, further comprising a conductive material portion located on a top surface of said at least two metal lines, wherein said at least one dielectric metal-diffusion barrier layer is located on said conductive material portion.

8. The metal interconnect structure of claim 1, wherein said at least one dielectric metal-diffusion barrier layer comprises a dielectric material selected from silicon nitride, silicon carbide nitride, silicon carbide, silicon boride, silicon carbide boride, a dielectric metal oxide, a dielectric metal nitride, a dielectric metal silicate, or a combination thereof.

9. A metal interconnect structure comprising:
   at least two metal lines embedded in a first dielectric material layer;
   a dielectric cap material layer located on a top surface of said first dielectric material layer and top surfaces of said at least two metal lines;
   a second dielectric material layer located above said dielectric cap material layer;
   a cavity embedded in said first and second dielectric material layers; and
   at least one dielectric metal-diffusion barrier layer contacting top surfaces of said at least two metal lines and sidewall surfaces of said first dielectric material layer, wherein said cavity is encapsulated by a material of said second dielectric material layer.

10. A metal interconnect structure comprising:
    at least two metal lines embedded in a first dielectric material layer;
    a dielectric cap material layer located on a top surface of said first dielectric material layer and top surfaces of said at least two metal lines;
    a second dielectric material layer located above said dielectric cap material layer;
    a cavity embedded in said first and second dielectric material layers; and
    a dielectric metal-diffusion barrier layer located on sidewall surfaces of said first dielectric material layer and laterally surrounding said cavity, wherein said dielectric metal-diffusion barrier layer is not present above an interface between said first dielectric material layer and said dielectric cap material layer, and a material of said second dielectric material layer contacts said first dielectric material layer through an opening in said dielectric metal-diffusion barrier layer underneath said cavity.

11. A metal interconnect structure comprising:
    at least two metal lines embedded in a first dielectric material layer;
    a dielectric cap material layer located on a top surface of said first dielectric material layer and top surfaces of said at least two metal lines;
    a second dielectric material layer located above said dielectric cap material layer;
    a cavity embedded in said first and second dielectric material layers; and
    at least one dielectric metal-diffusion barrier layer located at least on an upper surface of said dielectric cap material layer and including a portion located underneath said cavity, wherein a material of said second dielectric material layer encapsulates said cavity.

12. The metal interconnect structure of claim 11, wherein said at least one dielectric metal-diffusion barrier layer is a single contiguous layer of a dielectric metal-diffusion barrier material that laterally surrounds said cavity.

13. The metal interconnect structure of claim 12, wherein said cavity is spaced from said first dielectric material layer by said single contiguous layer.

14. The metal interconnect structure of claim 12, wherein said first dielectric material layer does not directly contact a material of said second dielectric material layer.

15. The metal interconnect structure of claim 11, wherein said at least one dielectric metal-diffusion barrier layer includes a first dielectric metal-diffusion barrier portion located on said upper surface of said dielectric cap material layer and a second dielectric metal-diffusion barrier portion located underneath said cavity.

16. The metal interconnect structure of claim 15, wherein a material of said second dielectric material layer contacts said first dielectric material layer between said first dielectric metal-diffusion barrier portion and said second metal-diffusion barrier portion.

17. The metal interconnect structure of claim 11, further comprising a conductive material portion located on a top surface of said at least two metal lines, wherein said at least one dielectric metal-diffusion barrier layer is located on said conductive material portion.

18. The metal interconnect structure of claim 11, wherein said at least one dielectric metal-diffusion barrier layer comprises a dielectric material selected from silicon nitride, silicon carbide nitride, silicon carbide, silicon boride, silicon carbide boride, a dielectric metal oxide, a dielectric metal nitride, a dielectric metal silicate, or a combination thereof.

* * * * *